United States Patent [19]

Sorscher

[11] Patent Number: 4,807,292
[45] Date of Patent: Feb. 21, 1989

[54] APPARATUS FOR CONVERTING A MOTOR VEHICLE PLUG-IN AUDIO UNIT INTO A REMOTE PLAYABLE UNIT

[76] Inventor: Bernard Sorscher, 75-74 199th St., Fresh Meadows, N.Y. 11366

[21] Appl. No.: 107,104

[22] Filed: Oct. 13, 1987

[51] Int. Cl.$^4$ .............................................. H05K 5/00
[52] U.S. Cl. ...................................... 381/86; 455/346; 360/137
[58] Field of Search ............................... 455/344–346, 455/349, 351; 307/150; 369/1, 6–9, 11–12; 360/137; 381/86

[56] References Cited

U.S. PATENT DOCUMENTS

| | | | |
|---|---|---|---|
| 2,866,891 | 12/1958 | Princ | 455/346 |
| 3,405,944 | 10/1968 | Krechman | 455/345 |
| 3,824,472 | 7/1974 | Engel et al. | 455/351 |
| 3,943,564 | 3/1976 | Tushinsky | 369/12 |
| 4,085,369 | 4/1978 | Burke | 455/345 |
| 4,324,951 | 4/1982 | Brown | 381/77 |
| 4,369,478 | 1/1983 | Sato et al. | 369/11 |
| 4,510,589 | 4/1985 | Ito | 369/11 |

FOREIGN PATENT DOCUMENTS

| | | | |
|---|---|---|---|
| 1148609 | 5/1963 | Fed. Rep. of Germany | 455/346 |
| 656269 | 9/1963 | Italy | 455/346 |

Primary Examiner—Jin F. Ng
Assistant Examiner—David H. Kim
Attorney, Agent, or Firm—Michael I. Kroll

[57] ABSTRACT

An apparatus for converting a motor vehicle plug-in audio unit into a remote playable unit is provided and consists of a housing to receive the audio unit, a circuit within the housing for supplying DC power to the audio unit and a pair of speakers electrically connected to the audio unit so that the audio unit can be played away from and independently of the motor vehicle.

9 Claims, 2 Drawing Sheets

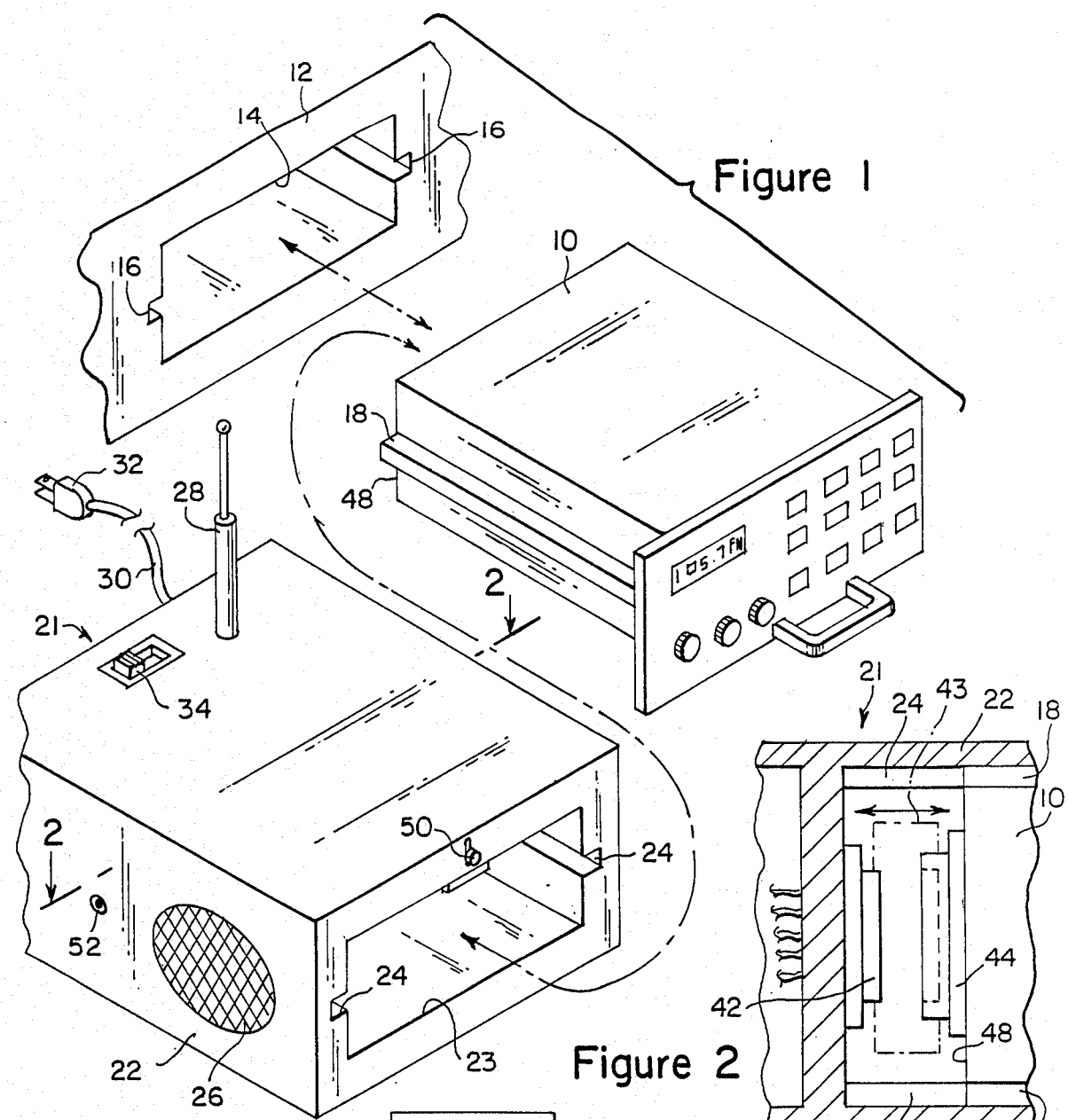

APPARATUS FOR CONVERTING A MOTOR VEHICLE PLUG-IN AUDIO UNIT INTO A REMOTE PLAYABLE UNIT

BACKGROUND OF THE INVENTION

1. Field of the Invention

The instant invention relates generally to audio devices and more specifically it relates to an apparatus for converting a motor vehicle plug-in audio unit into a remote playable unit.

2. Description of the Prior Art

Numerous audio devices have been provided in prior art that are adapted to plug into dashboards of motor vehicles and be removed therefrom by the owners of the motor vehicles to prevent theft of the audio devices therefrom. While these units may be suitable for the particular purpose to which they address, they would not be as suitable for the purposes of the present invention as heretofore described.

SUMMARY OF THE INVENTION

A primary object of the present invention is to provide an apparatus for converting a motor vehicle plug-in audio unit into a remote playable unit that will overcome the shortcomings of the prior art devices.

Another object is to provide an apparatus for converting a motor vehicle plug-in audio unit into a remote playable unit in which the apparatus contains a built-in battery pack, AC adapter and speakers so that the audio unit can be played away from and independently of the motor vehicle.

An additional object is to provide an apparatus for converting a motor vehicle plug-in audio unit into a remote playable unit in which the apparatus is structured to receive and adapt to any type of plug-in audio unit so that the apparatus can play the audio unit therefrom.

A further object is to provide an apparatus for converting a motor vehicle plug-in audio unit into a remote playable unit that is simple and easy to use.

A still further object is to provide an apparatus for converting a motor vehicle plug-in audio unit into a remote playable unit that is economical in cost to manufacture.

Further objects of the invention will appear as the description proceeds.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

FIG. 1 is a perspective view with parts broken away showing a plug-in audio unit, a motor vehicle dashboard and the invention to receive the audio unit.

FIG. 2 is a cross sectional view taken along line 2—2 in FIG. 1 showing the connectors therein.

FIG. 3 is a block diagram of the electrical circuitry of the invention.

DETAILED DESCRIPTION OF THE PREFERRED EMBODIMENTS

Figure 4:
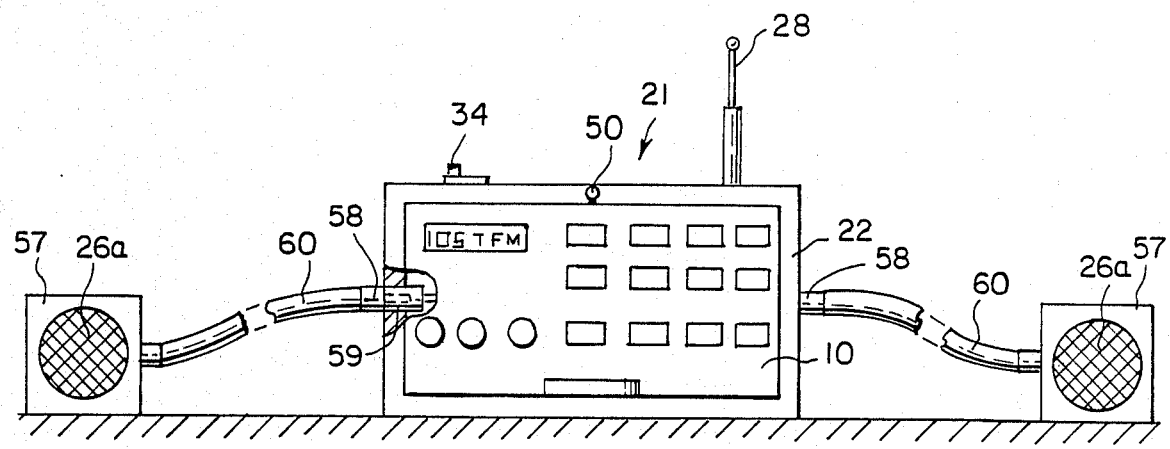
FIG. 4 is a front view of the invention showing a pair of remote external speakers removably attached thereto.

Turning now descriptively to the drawings, in which similar reference characters denote similar elements throughout the several views, FIGS. 1, 2 and 3 illustrate an apparatus 21 for converting a motor vehicle plug-in audio unit 10 into a remote playable unit. The apparatus 21 includes a housing 22 to receive the audio unit 10, a circuit 25 within the housing 22 for supplying DC power to the audio unit 10 and a pair of speakers 26 electrically connected to the audio unit 10 so that the audio unit can be played away from and independently of the motor vehicle (not shown). The audio unit 10 has tracks 18 which normally fit into an aperture 14 and slots 16 in a dashboard 12 in the motor vehicle.

The DC power supply circuit 25 includes a connector 42 located within the housing 22 for receiving connector 44 located on back wall 48 of the audio unit 10 and a battery 40 located within the housing 22 and electrically connected to the housing connector 42 for supplying DC power through the audio unit connector 44 and into the audio unit 10. An AC to DC battery charger 38 is located within the housing 22 and is electrically connected to the battery 40. A power cord 30 is electrically connected to the battery charger 38 and a power plug 32 is electrically connected to the power cord 30 for taking AC current through the power cord 30 into the battery charger 38 for charging the battery 40 when needed.

An AC to DC transformer 36 is located within the housing 22 and is electrically connected to the housing connector 42. A transfer switch 34 is located on the housing 22, is electrically connected in a first mode between the power plug 32 on the power cord 30 and the battery charger 38 and in a second mode between the power plug 32 on the power cord 30 and the transformer 36. When the transfer switch 34 is in the first mode the battery charger 38 will operate and when the transfer switch 34 is in the second mode the transformer 36 will operate to supply DC power through the audio unit connector 44 and into the audio unit 10. A telescopic antenna 28 is also located on the housing 22 and is electrically connected to the housing connector 42.

The speakers 26 can be built into the housing 22 as shown in FIGS. 1 and 3. A jack 52 on the housing 22 is electrically connected to the housing connector 42 while a pair of earphones 56 with a plug 54 is removably connected to the jack 52 to bypass the speakers 26.

FIG. 4 shows the apparatus 21 wherein each of the speakers is an external remote speaker 26a which includes a casing 57 for holding the speaker 26a. An elongated cord 60 is electrically connected to the speaker 26a and extends away from the casing 57. A speaker plug 58 is electrically connected to free end of the elongated speaker cord 60, while a socket 59 located on the housing 22 receives the speaker plug 58.

As best seen in FIGS. 1 and 2, the housing 22 has a front aperture 23 and a pair of oppositely positioned slots 24 on side walls thereof to receive the pair of tracks 18 from side of the audio unit 10. A latch member 50 is provided on the housing 22 adjacent from the aperture 23 to hold the audio unit 10 securely within the housing 22.

As best seen in FIG. 2, the apparatus 21 further contains an adapter connector 43, shown in phantom, to plug into the housing connector 42 so as to receive any type of audio unit connector 44.

Figure 5:
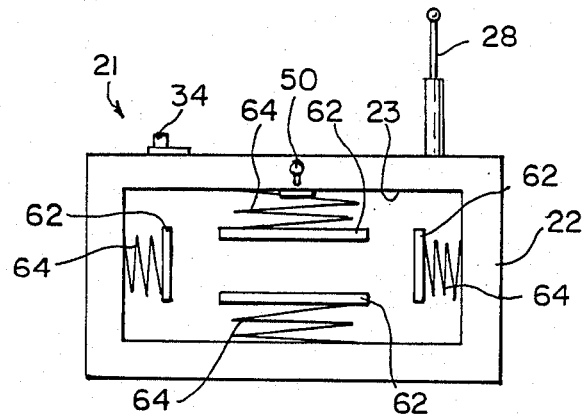
FIG. 5 is a front view of the invention showing spring biased plates to accept any of the various sized motor vehicle plug-in audio units.

FIG. 5 shows the apparatus 21 containing a plurality of springs 64, each of which is mounted to one side of the housing 22 within the aperture 23 and a plurality of plates 62, each of which is mounted to free end of one of the springs 64 so that any sized audio unit 10 can be placed into the aperture 23 and be held by the plates 62 so as to properly fit therein.

Figure 6:
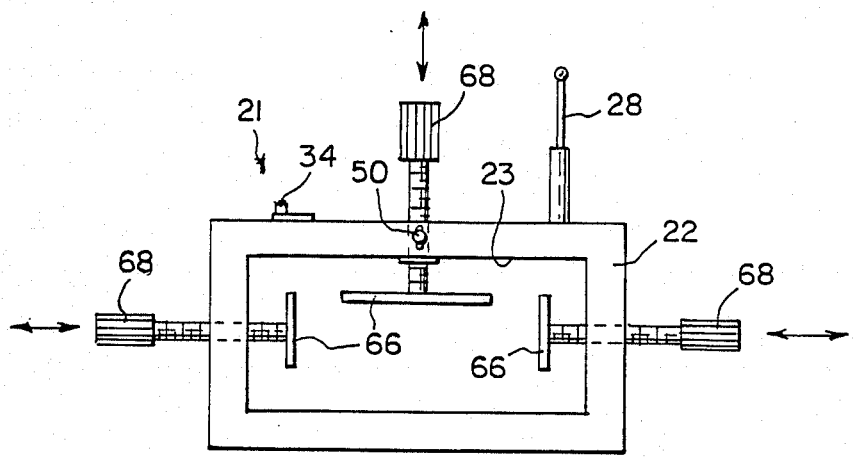
FIG. 6 is a front view similar to FIG. 5 showing adjustment screw plates to accept any of the various sized motor vehicle plug-in audio units.

FIG. 6 shows the apparatus 21 containing a plurality of adjustment screws 68, each of which is threadably mounted through one side of the housing 22 into the aperture 23, and a plurality of plates 66, each of which is mounted to free end of one of the adjustment screws 68 so that any sized audio unit 10 can be placed into the aperture 23 and be held by the plates 66 so as to properly fit therein.

It will be understood that each of the elements described above, or two or more together, may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. An apparatus for converting a motor vehicle plug-in audio unit into a remote playable unit which comprises:
    (a) a housing to receive the audio unit;
    (b) means within said housing for supplying DC power to the audio unit, said DC power supply means including a connector located within said housing for receiving a connector of the audio unit and a battery located within said housing and electrically connected to said housing connector for supplying DC power through the audio unit connector and into the audio unit and an AC to DC battery charger located within said housing and electrically connected to said battery and a power cord electrically connected to said battery charger and a power plug electrically connected to said power cord for taking AC current through said power cord into said battery charger for charging said battery when needed and an AC to DC transformer located within said housing and electrically connected to said housing connector and a transfer switch located on said housing and being electrically connected in a first mode between said power plug on said power cord and said battery charger and in a second mode between said power plug on said power cord and said transformer so that when said transfer switch is in said first mode said battery charger will operate and when said transfer switch is in said second mode said transformer will operate to supply DC power through the audio unit connector and into the audio unit; and
    (c) a pair of speakers electrically connected to the audio unit so that the audio unit can be played away from and independently of the motor vehicle.

2. An apparatus as recited in claim 1, further comprising a telescopic antenna located on said housing and electrically connected to said housing connector.

3. An apparatus as recited in claim 2, wherein said speakers are built into said housing.

4. An apparatus as recited in claim 3, further comprising:
    (a) a jack on said housing electrically connected to said housing connector; and
    (b) a pair of earphones with a plug to be removably connected to said jack to bypass said speakers.

5. An apparatus as recited in claim 2, wherein each of said speakers is an external remote speaker which includes:
    (a) a casing for holding said speaker;
    (b) an elongated cord electrically connected to said speaker and extending away from said casing;
    (c) a speaker plug electrically connected to free end of said elongated speaker cord; and
    (d) a socket located on said housing to receive said speaker plug.

6. An apparatus as recited in claim 2, further includes:
    (a) said housing having a front aperture and a pair of oppositely positioned slots on side walls thereof to receive a pair of tracks from side of the audio unit; and
    (b) a latch member on said housing adjacent said front aperture to hold the audio unit securely within said housing.

7. An apparatus as recited in claim 6, further comprising an adapter connector to plug into said housing connector so as to receive any type of audio unit connector.

8. An apparatus as recited in claim 6, further includes:
    (a) a plurality of springs, each of which is mounted to one side of said housing within the aperture; and
    (b) a plurality of plates, each of which is mounted to free end of one of said springs so that any sized audio unit can be placed into the aperture and be held by said plates so as to properly fit therein.

9. An apparatus as recited in claim 6, further includes:
    (a) a plurality of adjustment screws, each of which is threadably mounted through one side of said housing into the aperture; and
    (b) a plurality of plates, each of which is mounted to free end of one of said adjustment screws so that any sized audio unit can be placed into the aperture and be held by said plates so as to properly fit therein.

* * * * *